(12) United States Patent
Yatou

(10) Patent No.: US 10,622,246 B2
(45) Date of Patent: Apr. 14, 2020

(54) SUBSTRATE BONDING METHOD

(71) Applicant: DENSO CORPORATION, Kariya, Aichi-pref. (JP)

(72) Inventor: Masakazu Yatou, Kariya (JP)

(73) Assignee: DENSO CORPORATION, Kariya (JP)

(*) Notice: Subject to any disclaimer, the term of this patent is extended or adjusted under 35 U.S.C. 154(b) by 14 days.

(21) Appl. No.: 15/550,062

(22) PCT Filed: Feb. 25, 2016

(86) PCT No.: PCT/JP2016/001025
§ 371 (c)(1),
(2) Date: Aug. 10, 2017

(87) PCT Pub. No.: WO2016/143282
PCT Pub. Date: Sep. 15, 2016

(65) Prior Publication Data
US 2018/0033680 A1  Feb. 1, 2018

(30) Foreign Application Priority Data

Mar. 10, 2015 (JP) .................. 2015-47504
Jan. 28, 2016 (JP) .................. 2016-14852

(51) Int. Cl.
*H01L 21/762* (2006.01)
*B32B 37/06* (2006.01)
*B32B 38/00* (2006.01)

(52) U.S. Cl.
CPC ........ *H01L 21/76251* (2013.01); *B32B 37/06* (2013.01); *B32B 38/0008* (2013.01); *H01L 21/762* (2013.01); *B32B 2457/14* (2013.01)

(58) Field of Classification Search
None
See application file for complete search history.

(56) References Cited

U.S. PATENT DOCUMENTS

2003/0211705 A1* 11/2003 Tong .................. H01L 21/0206
438/455
2011/0111594 A1  5/2011 Kikuchi
(Continued)

FOREIGN PATENT DOCUMENTS

JP  2010-263160 A  11/2010

OTHER PUBLICATIONS

M. J. Kim and R.W. Carpenter, Composition and structure of native oxide on silicon by high resolution analytical electron microscopy, Feb. 1990, Mater.Res., vol. 5. No. 2. (Year: 1990).*

*Primary Examiner* — Seahvosh Nikmanesh
*Assistant Examiner* — Xiaoming Liu
(74) *Attorney, Agent, or Firm* — Posz Law Group, PLC

(57) ABSTRACT

A substrate bonding method includes: preparing a first substrate having a first silicon oxide film with a film thickness of 50 nm or more arranged on the first substrate, and a second substrate having a second silicon oxide film arranged on the second substrate; bonding the first substrate and the second substrate together in a state where the first silicon oxide film and the second silicon oxide film face each other; and heating and bonding the first substrate and the second substrate. The preparing of the first substrate and the second substrate includes preparing the second substrate having the second silicon oxide film with a film thickness of 2.5 nm or less. The heating and bonding of the first substrate and the second substrate includes heating the first substrate and the second substrate at a temperature of 200° C. or more and 800° C. or less.

15 Claims, 5 Drawing Sheets

(56) References Cited

U.S. PATENT DOCUMENTS

2013/0299080 A1* 11/2013 Plach ............... H01L 21/187
                                                156/272.6
2015/0132923 A1*  5/2015 Gaudin ............ H01L 21/76251
                                                438/459

* cited by examiner

SUBSTRATE BONDING METHOD

CROSS REFERENCE TO RELATED APPLICATIONS

This application is a U.S. national stage application of International Patent Application No. PCT/JP2016/001025 filed on Feb. 25, 2016 and is based on Japanese Patent Applications No. 2015-47504 filed on Mar. 10, 2015, and No. 2016-14852 filed on Jan. 28, 2016, the disclosures of which are incorporated herein by reference.

TECHNICAL FIELD

The present disclosure relates to a substrate bonding method for bonding a first substrate having a first silicon oxide film formed on a surface of the first substrate and a second substrate having a second silicon oxide film formed on a surface of the second substrate to each other.

BACKGROUND ART

Up to now, as disclosed in Patent Literature 1, a method of manufacturing an SOI wafer in which two silicon wafers are bonded together has been known. First, an oxide film is formed on both of the silicon wafers. Then, the silicon wafers are bonded together through the oxide film. The silicon wafers have been bonded together, and thereafter heated. A heating temperature is set to 1200° C. or more in order to secure a bonding strength. With the above process, the SOI wafer can be manufactured.

In the above method, a water may be generated at a bonding interface between the silicon wafers due to heating. If the water is generated at the interface, a bonding strength may be reduced. On the other hand, it is known that a film thickness of the oxide film in one silicon wafer is set to 50 nm or more in order to prevent the reduction in the bonding strength. With an increase in the film thickness of the oxide film, water generated by heating is absorbed by the oxide film, and the reduction in the bonding strength can be prevented.

However, similarly in the above method, in order to secure the bonding strength, there is a need to heat the silicon wafer at high temperature. Since a wiring made of aluminum or the like and an impurity diffusion layer are formed on the silicon wafer, a maximum temperature at which the silicon wafer can be heated is determined according to a heat resistant temperature of the wiring and a temperature at which the impurity diffusion layer diffuses. According to the maximum temperature, in general, the temperature at which the silicon wafer can be heated is set to 800° C. or less. Therefore, in a method of heating at the high temperature described above, the SOI wafer cannot be manufactured.

On the other hand, it is conceivable to manufacture the SOI wafer through a method in which the oxide film is formed on one surface of the silicon wafer and no oxide film is formed on the other surface. In more detail, the silicon wafers are bonded to each other due to Si—$SiO_2$ bonding to manufacture the SOI wafer. In the bonding method, the bonding strength is secured while the heating temperature kept low. However, in the bonding method, when the silicon wafers are bonded together, no oxide films can be formed on both of the silicon wafer surfaces.

By the way, it is known that with the formation of the oxide film on the silicon wafer surface, out-diffusion can be prevented, and an interface level can be reduced. On the other hand, in the above configuration, since the oxide film cannot be formed on both of the silicon wafer surfaces, the out-diffusion may occur, and the interface level may become large. According to the above configuration, a leakage current may occur in the SOI wafer. Further, in the above-described configuration in which the oxide film cannot be formed on both of the silicon wafer surfaces, the degree of freedom in designing the SOI wafer may decrease.

PATENT LITERATURE

Patent Literature 1: JP-2010-263160-A

SUMMARY

It is an object of the present disclosure to provide a substrate bonding method capable of preventing a reduction in the bonding strength without heating at a high temperature in a method of bonding silicon oxide films to each other in a face-to-face manner.

According to a first aspect of the present disclosure, a substrate bonding method includes: preparing a first substrate having a first silicon oxide film with a film thickness of 50 nm or more arranged on a surface of the first substrate, and a second substrate having a second silicon oxide film arranged on a surface of the second substrate; bonding the first substrate and the second substrate together in a state where the first silicon oxide film and the second silicon oxide film face each other after the preparing of the first substrate and the second substrate; and heating and bonding the first substrate and the second substrate after the bonding of the first substrate and the second substrate. The preparing of the first substrate and the second substrate includes preparing the second substrate having the second silicon oxide film with a film thickness of 2.5 nm or less. The heating and bonding of the first substrate and the second substrate includes heating the first substrate and the second substrate at a temperature of 200° C. or more and 800° C. or less.

In the method described above, the film thickness of the first silicon oxide film is set to 50 nm or more. For that reason, even if a water is generated at an interface between the first substrate and the second substrate due to heating, because the generated water can be absorbed by the first silicon oxide film, a reduction in the bonding strength between the first substrate and the second substrate can be prevented.

In the method described above, the film thickness of the second silicon oxide film is set to 2.5 nm or less. According to the above configuration, in the heating process, the heating temperature necessary for securing the bonding strength can be set to 800° C. or less, which is lower than the conventional temperature. In other words, a reduction in the bonding strength can be prevented without heating at the high temperature.

As described above, in the bonding method of bonding the first substrate and the second substrate so that the silicon oxide films face each other, a reduction in the bonding strength can be prevented without heating at the high temperature.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
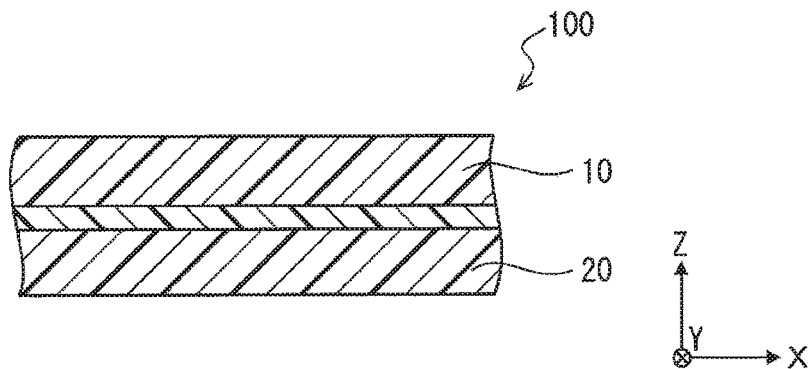
FIG. 1 is a cross-sectional view showing a schematic configuration of an SOI substrate according to a first embodiment.

Hereinafter, embodiments of the present disclosure will be described with reference to the drawings. In the respective embodiments described below, the common or associated elements are given the same reference numerals. A thickness direction of a first substrate is indicated as a Z-direction, a specific direction orthogonal to the Z-direction is indicated as an X-direction, and a direction orthogonal to the Z-direction and the X-direction is indicated as a Y-direction. A shape along a plane defined by the X-direction and the Y-direction is indicated as a planar shape.

First Embodiment

First, a schematic configuration of an SOI substrate 100 will be described with reference to FIG. 1.

The SOI substrate 100 is formed by bonding a first substrate 10 and a second substrate 20 to each other. A method of manufacturing the SOI substrate 100, that is, a method of bonding the first substrate 10 and the second substrate 20 will be described in detail below. A wiring not shown and an impurity diffusion layer not shown are formed in the SOI substrate 100. The wiring is made of a metal material such as aluminum. The impurity diffusion layer is formed by ion implantation, for example. The impurity diffusion layer forms a MOS transistor.

Next, a bonding method of the first substrate 10 and the second substrate 20 will be described with reference to FIGS. 2 to 10.

Figure 2:
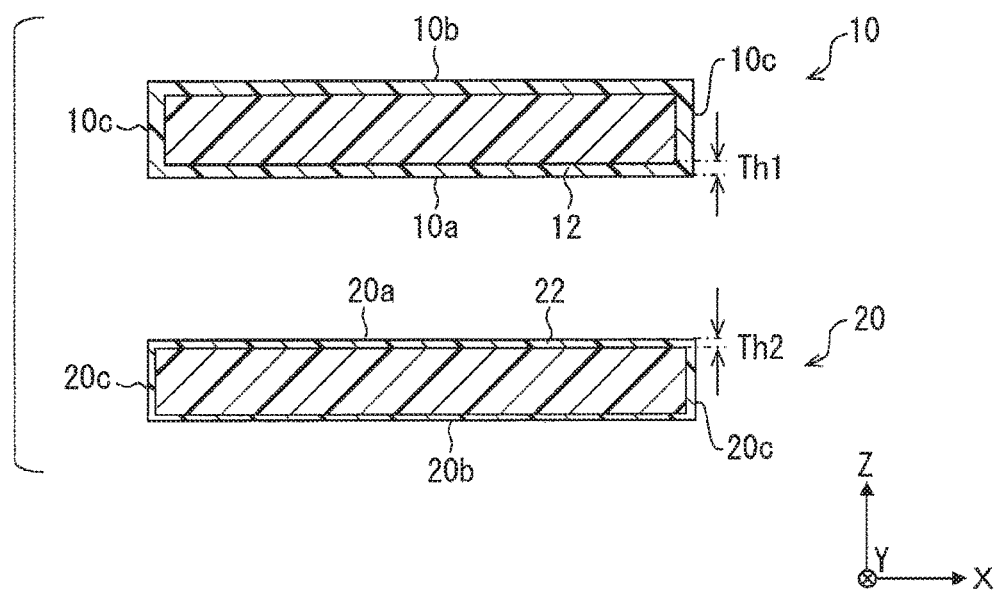
FIG. 2 is a cross-sectional view showing a preparation process.

First, as shown in FIG. 2, a preparation process for preparing the first substrate 10 and the second substrate 20 is performed. In the present embodiment, a silicon substrate is used as the first substrate 10. The first substrate 10 has a front surface 10a perpendicular to the Z direction, a back surface 10b opposite to the front surface 10a, and a side surface 10c parallel to the Z-direction.

A first silicon oxide film 12 is formed on the front surface 10a. Furthermore, the first silicon oxide film 12 is also formed on the back surface 10b and the side surface 10c. Hereinafter, a thickness of the first silicon oxide film 12 formed on the front surface 10a is referred to as a film thickness Th1. The film thickness Th1 is set to 50 nm or more. In the present embodiment, the film thickness Th1 is set to 1.0 μm. Wirings and the impurity diffusion layer not shown are formed on the first substrate 10.

In the present embodiment, the second substrate 20 is formed of a silicon substrate. The second substrate 20 has a front surface 20a perpendicular to the thickness direction, a back surface 20b opposite to the front surface 20a, and a side surface 20c parallel to the thickness direction.

A second silicon oxide film 22 is formed on the front surface 20a. Furthermore, the second silicon oxide film 22 is also formed on the back surface 20b and the side surface 10c. Hereinafter, a film thickness of the second silicon oxide film 22 formed on the front surface 20a is referred to as a film thickness Th2. The film thickness Th2 is set to 2.5 nm or less. In other words, the second silicon oxide film 22 is formed so as to satisfy 0 nm<film thickness Th2≤2.5 nm. Similarly to the first substrate 10, wirings not shown and an impurity diffusion layer are formed on the second substrate 20. The planar shape of the second substrate 20 is substantially the same as the planar shape of the first substrate 10. Hereinafter, the first silicon oxide film 12 and the second silicon oxide film 22 will be referred to as silicon oxide films 12 and 22.

In the preparation process, the second silicon oxide film 22 can be formed by immersing the second substrate 20 in an aqueous solution. In this method, an aqueous solution used for RCA cleaning, sulfuric acid/hydrogen peroxide, and ozone water are employed as the aqueous solution. In this method, in order to form the second silicon oxide film 22, the second substrate 20 is not heated. The method of forming the first silicon oxide film 12 may be different from or the same as the method of forming the second silicon oxide film 22.

As a method of forming the second silicon oxide film 22, the second substrate 20 may be heated. In other words, the second silicon oxide film 22 may be formed by thermal oxidation. In other words, the second silicon oxide film 22 may be a thermal oxide film. In the method, first, the second substrate 20 is cleaned. As a method of cleaning, a method of cleaning with sulfuric acid/hydrogen peroxide or hydrofluoric acid, or RCA cleaning can be employed. Contaminants and the like can be removed due to cleaning. The cleaned second substrate 20 is heated to form the second silicon oxide film 22 on the second substrate 20.

In the heating method, for example, a furnace or an RTP apparatus is used. In the present embodiment, the first substrate 10 and the second substrate 20 are heated with the use of the furnace to form the silicon oxide films 12 and 22. In the present embodiment, a heating temperature is 600° C. and a heating time is 1 hour as the heating conditions in the furnace.

Further, the second silicon oxide film 22 may be formed by deposition or plasma. In the method using plasma, the second silicon oxide film 22 is formed, for example, by performing a CVD method using TEOS or performing $O_2$ ashing. TEOS is tetrahexysilane. The second silicon oxide film 22 formed with the use of TEOS can also be referred to as a TEOS film. CVD is an abbreviation for Chemical Vapor Deposition. As a method of depositing, the second silicon oxide film 22 is formed by applying SOG to the second substrate 20. SOG is an abbreviation for Spin On Glass.

Figure 3:
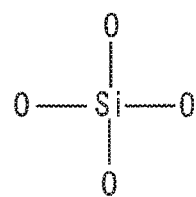
FIG. 3 is a diagram showing a structure of $SiO_2$.

The silicon oxide films 12 and 22 have $SiO_2$ and suboxide as silicon oxide. A silicon atom has four bond hands. As shown in FIG. 3, in the silicon atoms configuring $SiO_2$, oxygen atoms are bonded to the respective bonding hands and are bonded to four oxygen atoms. The silicon atoms configuring $SiO_2$ can also be referred to as $Si^{4+}$.

Figure 4:
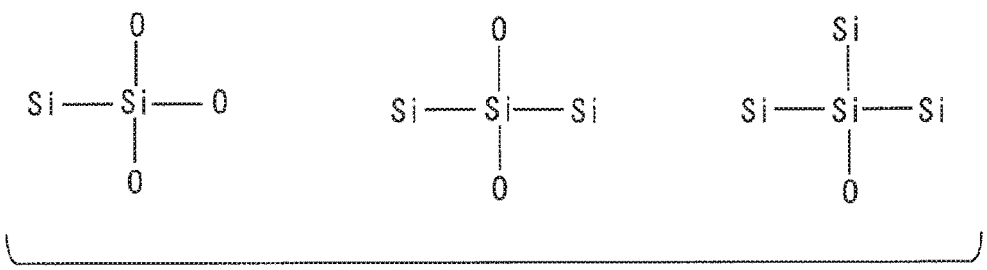
FIG. 4 is a diagram showing a structure of a suboxide.

As shown in FIG. 4, the suboxide is a silicon oxide having a chemically different structure from $SiO_2$. The silicon oxide films 12 and 22 chemically have three kinds of suboxides having different structures. $Si^{3+}$, $Si^{2+}$, and $Si^+$ exist as silicon atoms configuring the suboxide.

In $Si^{3+}$, oxygen atoms are bonded to each of the three bond hands, and silicon atoms are bonded to one bond hand. In $Si^{2+}$, oxygen atoms are bonded to each of the two bonding hands, and silicon atoms are bonded to the other two bonding hands. In $Si^+$, oxygen atoms are bonded to one bonding hand, and silicon atoms are bonded to each of the three bonding hands.

The silicon oxide films 12 and 22 contain hydroxyl groups. It is known that in the silicon oxide films 12 and 22, as the number of suboxides increases, the number of hydroxyl groups increases. It is also known that as the film thicknesses of the silicon oxide films 12 and 22 are thinner, the ratio of the number of suboxide to the number of $SiO_2$ increases. In other words, as the film thickness of the silicon oxide films 12 and 22 is thinner, the density of hydroxyl groups is higher.

Figure 5:
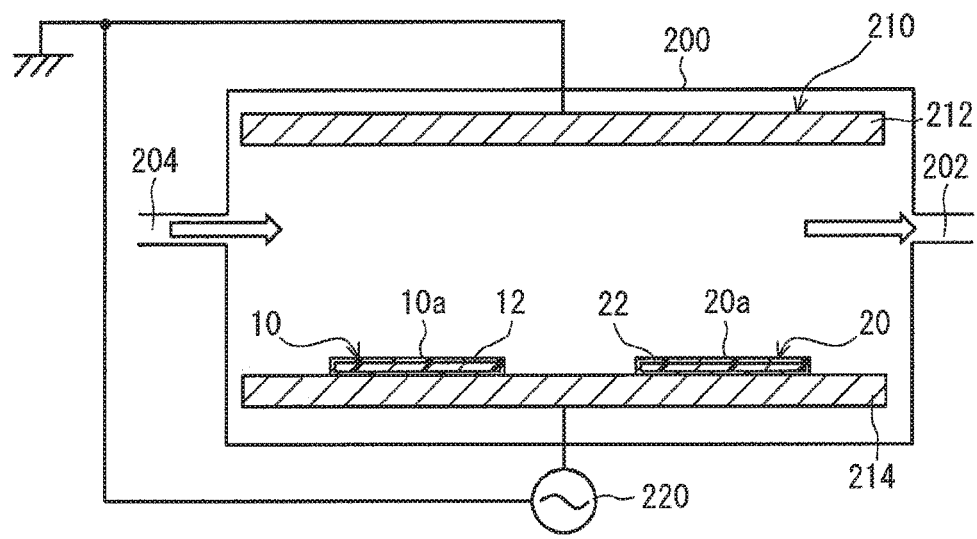
FIG. 5 is a cross-sectional view showing an activation process.
Figure 6:
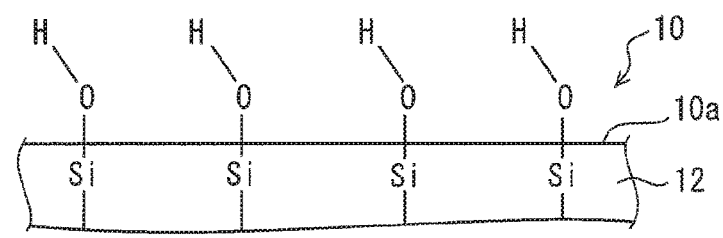
FIG. 6 is an enlarged cross-sectional view showing the activation process.

After the preparation process has been implemented, as shown in FIGS. 5 and 6, an activation process of introducing hydroxyl groups to the silicon oxide films 12 and 22 is implemented. In the present embodiment, the activation process is implemented with the use of a chamber 200, an electrode 210, and a high frequency power supply 220. The chamber 200 has an exhaust port 202 and an intake port 204. The electrode 210 has an anode 212 and a cathode 214. The anode 212 and the cathode 214 are opposed to each other with a predetermined distance in the chamber 200. The anode 212 and the cathode 214 are connected to the high frequency power supply 220.

In the activation process, first, the first substrate 10 and the second substrate 20 are disposed on the cathode 214. Specifically, the first substrate 10 and the second substrate 20 are disposed so that the front surface 10a and the front surface 20a face the anode 212.

In the present embodiment, the first substrate 10 and the second substrate 20 are activated by plasma. As a method of activation by plasma, a method of generating plasma by setting the inside of the chamber 200 to an atmospheric pressure, and a method of generating plasma by making the inside of the chamber 200 into a vacuum can be employed. In the method of setting the inside of the chamber 200 to the atmospheric pressure, hydroxyl groups can be more effectively introduced to the silicon oxide films 12 and 22. For that reason, in the present embodiment, the method of setting the inside of the chamber 200 to the atmospheric pressure is employed.

In the present embodiment, a gas for generating a plasma is introduced into the chamber 200 through the intake port 204 while being exhausted by the exhaust port 202. As the gas, for example, at least one type of gas selected from $O_2$, $N_2$, Ar, $H_2O$, and air can be employed. That is, both of a single gas and a mixed gas can be employed. In the present embodiment, a mixed gas of $O_2$, $N_2$, and $H_2O$ is employed. With the use of the mixed gas, hydroxyl groups can be more effectively introduced to the silicon oxide films 12 and 22. White arrows in FIG. 5 indicate a direction in which the gas is exhausted and a direction in which the gas is suctioned.

Next, an electric power is applied between the electrodes 210 by the high frequency power supply 220. As a result, plasma is generated. The first silicon oxide film 12 formed on the front surface 10a and the second silicon oxide film 22 formed on the front surface 20a are exposed to the plasma.

As shown in FIG. 6, the hydroxyl group is introduced to the first silicon oxide film 12 by plasma. Similarly to the first silicon oxide film 12, the hydroxyl group is also introduced to the second silicon oxide film 22. The silicon atoms located on the front surface 10a and the front surface 20a are bonded to the hydroxyl group. The hydroxyl group can also be referred to as an OH group or a hydroxyl group.

Figure 7:
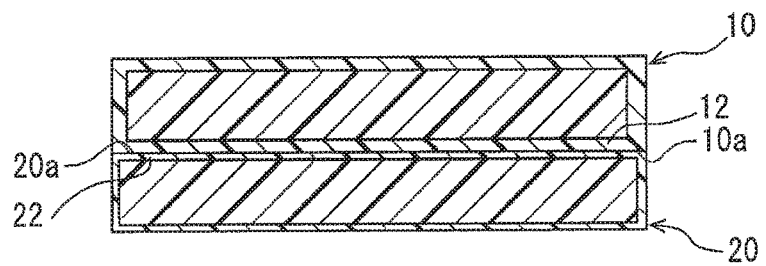
FIG. 7 is a cross-sectional view showing a bonding process.
Figure 8:
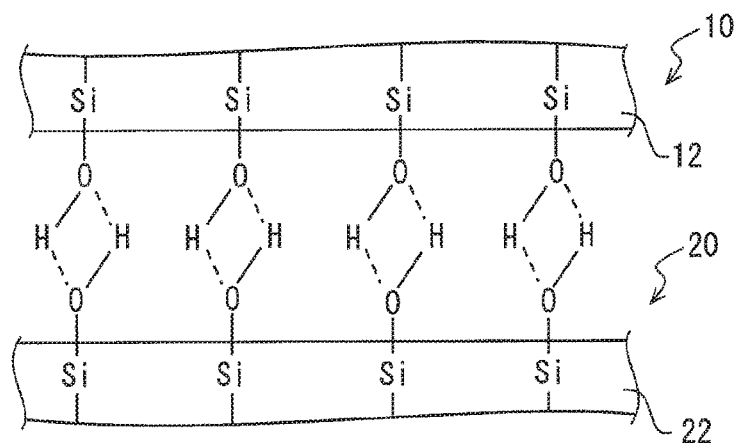
FIG. 8 is an enlarged cross-sectional view showing the bonding process.

After the activation process has been implemented, as shown in FIGS. 7 and 8, a bonding step of pasting the first substrate 10 and the second substrate 20 together is implemented. As shown in FIG. 7, the first substrate 10 and the second substrate 20 are bonded together so that the front surface 10a and the front surface 20a face each other. The bonding step is carried out at room temperature. With the bonding, the first silicon oxide film 12 and the second silicon oxide film 22 come into contact with each other and are bonded to each other. As shown in FIG. 8, the silicon oxide films 12 and 22 are hydrogen-bonded to each other. Specifically, the hydroxyl groups of the first silicon oxide film 12 and the hydroxyl groups of the second silicon oxide film 22 are hydrogen-bonded together. In FIG. 8, hydrogen bonds are indicated by broken lines.

Figure 9:
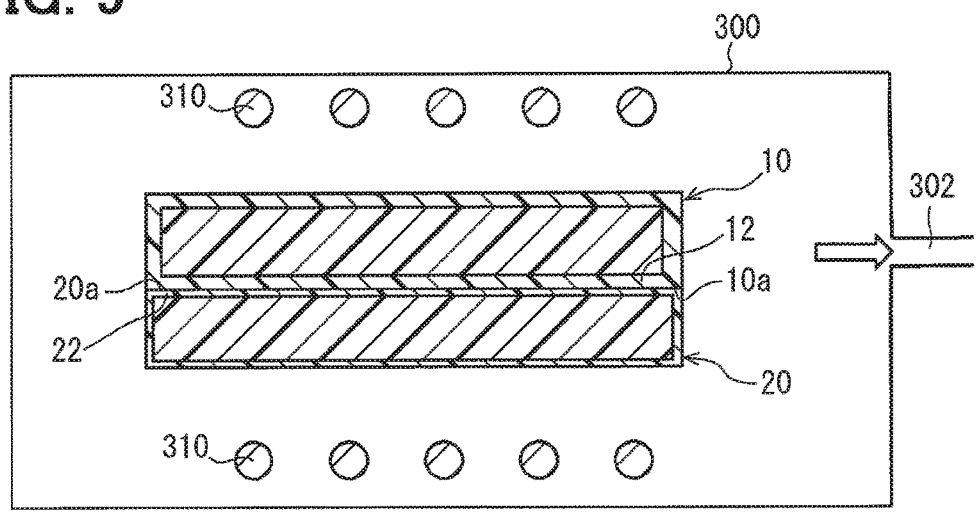
FIG. 9 is a cross-sectional view showing a heating process.
Figure 10:
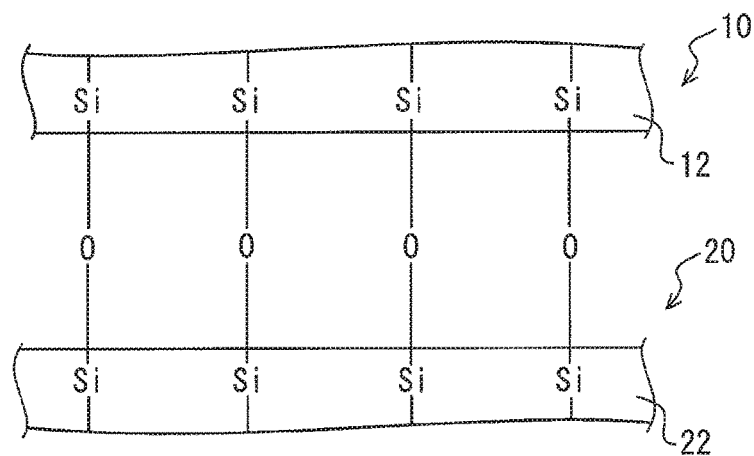
FIG. 10 is an enlarged cross-sectional view showing the heating process.

After the bonding step has been implemented, as shown in FIGS. 9 and 10, a heating process of heating and bonding the first substrate 10 and the second substrate 20 together is implemented. In the present embodiment, the heating process is performed with the use of a chamber 300 and a heater 310. The chamber 300 has an exhaust port 302. The heater 310 is disposed in the chamber 300.

In the heating process, first, as shown in FIG. 9, the first substrate 10 and the second substrate 20 are arranged in the chamber 300. Then, the gas is heated by the heater 310 while the gas is exhausted in the chamber 300 through the exhaust port 302. The white arrows in FIG. 9 indicate the exhausting direction. Due to heating, a water escapes from hydrogen bonding between the silicon oxide films 12 and 22. As a result, as shown in FIG. 10, the bonding between the silicon oxide films 12 and 22 changes from hydrogen bonding to covalent bonding. Specifically, silicon atoms of the first silicon oxide film 12 and silicon atoms of the second silicon oxide film 22 are bonded to each other through oxygen atoms.

In the heating process, the heating temperature is set to 200° C. or more and 800° C. or less. The heating temperature is set to 200° C. or higher, whereby the bonding between the silicon oxide films 12 and 22 can be changed from hydrogen bonding to covalent bonding.

The maximum heating temperature of 800° C. is lower than a heatproof temperature of the wirings formed on the first substrate 10 and the second substrate 20. Further, when the heating temperature is set to 800° C. or less, thereby being capable of preventing the impurity diffusion layer formed on the first substrate 10 and the second substrate 20 from diffusing. In the present embodiment, the heating temperature is set to 750° C. Further, the heating temperature may be set to 300° C.

As described above, the first substrate 10 and the second substrate 20 can be bonded to each other. In order to manufacture the SOI substrate 100, after the heating process has been implemented, a removing process of removing parts of the first substrate 10 and the second substrate 20 is performed. In the first substrate 10 and the second substrate 20 bonded to each other, the back surface 10b, the back surface 20b, the side surface 10c, and the side surface 20c are polished and etched. As a result, the silicon oxide films 12 and 22 formed on the back surface 10b, the back surface 20b, the side surface 10c, and the side surface 20c are removed. Thus, the SOI substrate 100 shown in FIG. 1 can be manufactured.

Next, the bonding strength between the first substrate 10 and the second substrate 20 will be described with reference to FIG. 11.

Figure 11:
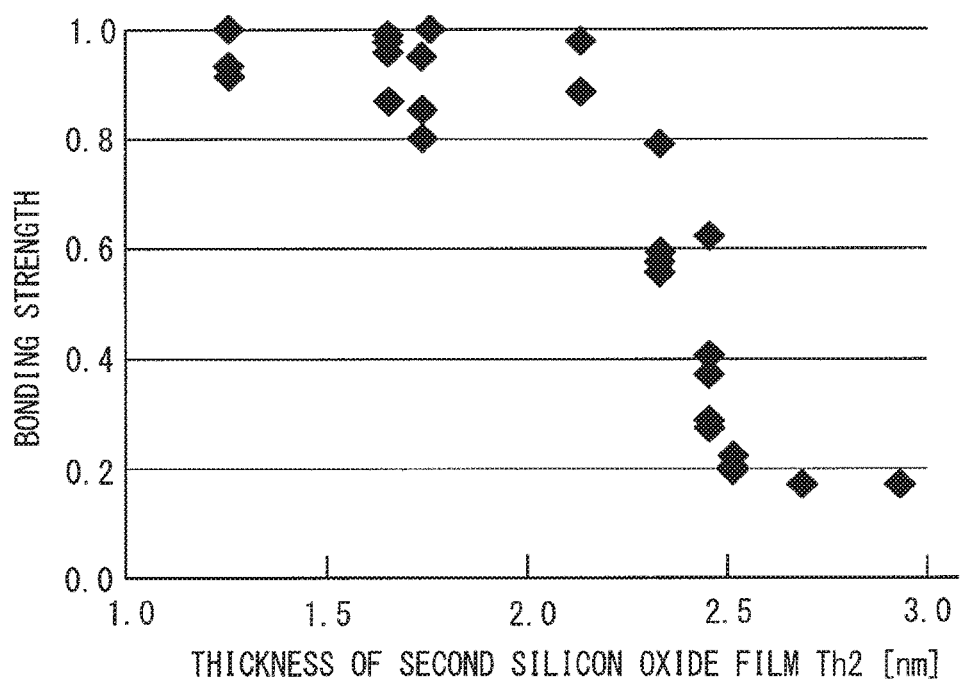
FIG. 11 is a diagram showing a bonding strength between the first substrate and the second substrate relative to a film thickness of the second silicon oxide film.

FIG. 11 is a diagram showing the bonding strength of the first substrate 10 and the second substrate 20 with respect to the SOI substrate 100 manufactured by the method described above. A value of the bonding strength shown in FIG. 11 indicates the bonding strength of the first substrate 10 and the second substrate 20 on which the silicon oxide films 12, 22 are formed by thermal oxidation.

Hereinafter, the bonding strength of the first substrate 10 and the second substrate 20 is simply referred to as bonding strength. The bonding strength is measured for multiple SOI substrates 100 different in film thickness Th2. For comparison, the SOI substrate 100 with the thickness Th2 greater than 2.5 nm and the SOI substrate 100 with the film thickness Th2 of approximately 0 nm are manufactured by the method described above, and the bonding strength is measured. In all of the SOI substrates 100 for which the bonding strength is measured, the film thickness Th1 is set to 1.0 μm and the heating temperature in the heating process is set to 750° C.

FIG. 11 shows the value of the bonding strength in the case where the bonding strength is set to 1.0 when the film thickness Th2 is approximately 0 nm. In other words, the value of the bonding strength shown in FIG. 11 is a value obtained by dividing the bonding strength when the film thickness Th2 is a predetermined thickness by the bonding strength when the film thickness Th2 is approximately 0 nm. In addition, in FIG. 11, when the film thickness Th2 is a specific thickness, the bonding strength shows multiple values. This shows a value obtained by manufacturing the SOI substrate 100 having substantially the same film thickness Th2 and measuring the bonding strength for each manufactured SOI substrate 100.

As shown in FIG. 11, when the heating temperature in the heating process is kept constant, as the film thickness Th2 is thinner, the bonding strength is higher. This is because as the film thickness Th2 is thinner, the density of hydroxyl groups in the second silicon oxide film 22 is higher, and the number of hydrogen bonds in the bonding between the silicon oxide films 12 and 22 is larger in the bonding step. As the number of hydrogen bonds is larger, the number of covalent bonds is larger in the heating process with the result that the bonding strength is higher.

With the film thickness Th2 of 2.5 nm as the boundary, the bonding strength greatly changes. In other words, when the film thickness Th2 is larger than 2.5 nm, the bonding strength is lower, and when the film thickness is 2.5 nm or less, the bonding strength is higher. Hereinafter, the thickness Th2 at which the bonding strength greatly changes is indicated as the boundary film thickness. When the film thickness Th2 is larger than 2.5 nm, the bonding strength is smaller than 0.2.

In addition, when the film thickness Th2 is set to 2.0 nm or less, the bonding strength is set to 0.8 or more. In the range of 1.5 nm or more and 2.0 nm or less, the measurement is carries out for eight SOI substrates 100, and all of the bonding strengths are set to 0.8 or more. According to the above results, the film thickness Th is set to 2.0 nm or less, to thereby easily secure the bonding strength of 0.8 or more.

As described above, as the film thickness Th2 is thinner, the bonding strength can be increased more. Further, as the heating temperature in the heating process is higher, the bonding strength can be increased more. This is because as the heating temperature is higher, the bonding is likely to be changed from hydrogen bonding to covalent bonding. As described above, when the heating temperature in the heating process is changed with the film thickness Th2 set as the predetermined thickness, as the heating temperature is lower, the boundary film thickness becomes thinner.

Next, the advantages of the substrate bonding method described above will be described.

In the present embodiment, the film thickness Th1 is set to 50 nm or more. For that reason, even if a water is generated at an interface between the first substrate 10 and the second substrate 20 due to heating, because the generated water can be absorbed by the first silicon oxide film 12, the reduction in the bonding strength can be prevented.

In the present embodiment, the film thickness Th2 is set to 2.5 nm or less. According to the above configuration, in the heating process, the heating temperature necessary for securing the bonding strength can be set to 800° C. or less, which is lower than the conventional temperature. In other words, a reduction in the bonding strength can be prevented without heating at the high temperature.

As described above, in the bonding method of bonding the first substrate 10 and the second substrate 20 so that the silicon oxide films 12 and 22 face each other, a reduction in the bonding strength can be prevented without heating at the high temperature.

In the present embodiment, an activation process of introducing hydroxyl groups to the silicon oxide films 12 and 22 is implemented. With the implementation of the activation process, more hydroxyl groups can be introduced to the silicon oxide films 12 and 22. According to the above configuration, the number of hydrogen bonds can be increased in the bonding step, and consequently the number of covalent bonds can be increased in the heating process. Therefore, the bonding strength can be further increased.

Further, in the present embodiment, the silicon oxide films 12 and 22 are formed by thermal oxidation. According to the above configuration, the dense silicon oxide films 12 and 22 can be formed in comparison with other methods. Therefore, out-diffusion can be reduced.

On the other hand, in the method of forming the second silicon oxide film 22 by immersing the second substrate 20 in an aqueous solution, there is no need to heat as compared with the forming method by thermal oxidation, and the process can be simplified. In addition, as compared with the forming method by thermal oxidation, the film thickness Th2 can be easily reduced. In other words, the second substrate 20 with the film thickness Th2 set to 2.5 nm or less is easily produced. Furthermore, as compared with the forming method by thermal oxidation, the density of hydroxyl groups in the second silicon oxide film 22 can be increased, and the bonding strength can be further increased.

Figure 12:
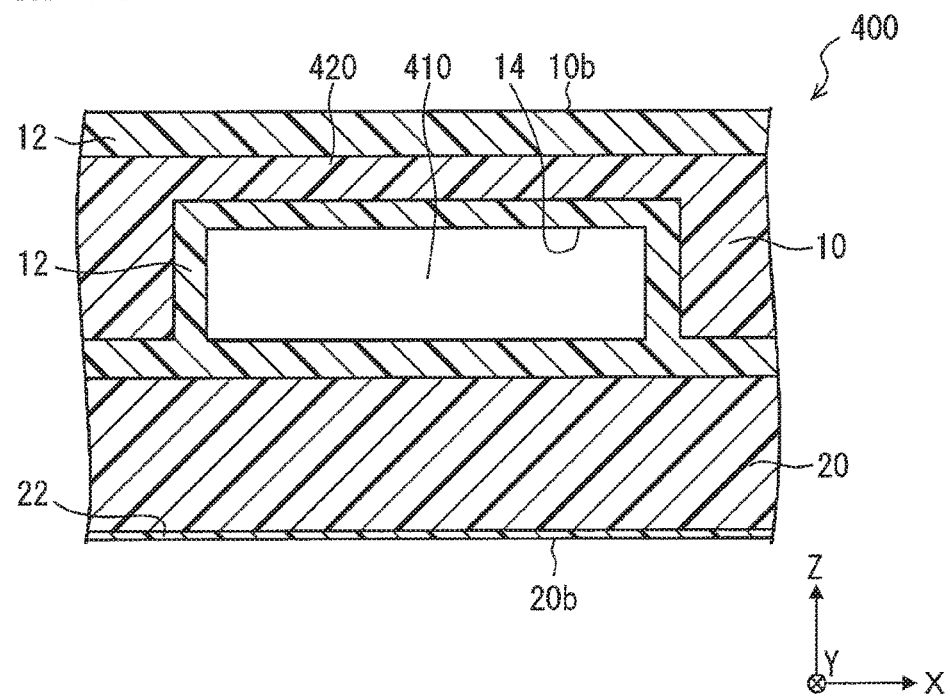
FIG. 12 is a cross-sectional view showing a schematic configuration of a pressure sensor according to a first modification.

In the embodiment described above, an example in which the first substrate 10 and the second substrate 20 are bonded to each other to manufacture the SOI substrate 100 has been described, but the present disclosure is not limited to the above example. As shown in the first modification of FIG. 12, a pressure sensor 400 may be manufactured by bonding the first substrate 10 and the second substrate 20 to each other. The pressure sensor 400 is configured to detect a pressure of a measurement medium.

Figure 13:
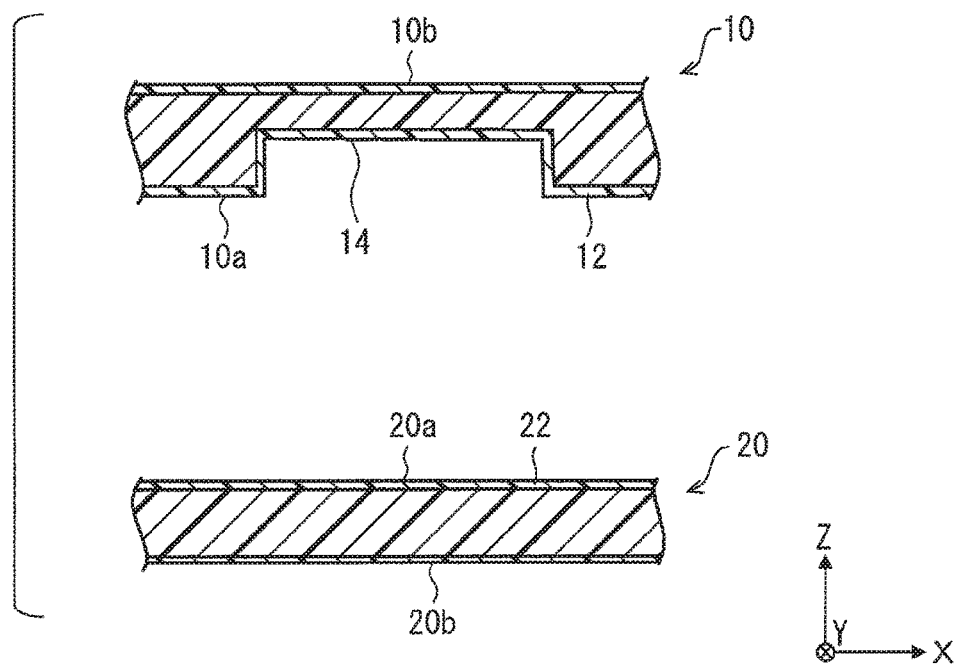
FIG. 13 is a cross-sectional view showing a preparation process.

In the first modification, as shown in FIG. 13, the first substrate 10 on which a concave portion 14 is formed is prepared in the preparation process. The concave portion 14 is recessed with a predetermined depth from the surface 10a. The steps subsequent to the bonding step are the same as those in the first embodiment.

The pressure sensor 400 has a pressure reference chamber 410, a diaphragm 420, and a pressure detection element not shown. The pressure reference chamber 410 is a space surrounded by the concave portion 14 and the front surface 20a. The pressure reference chamber 410 is air-tightly sealed, and an internal pressure is kept substantially constant. The diaphragm 420 is a portion whose thickness is reduced by the concave portion 14 in the first substrate 10. The diaphragm 420 deforms in the thickness direction of the first substrate 10 according to a pressure of the measurement medium. The pressure detection element is formed in the diaphragm 420 and outputs a detection signal according to a deformation of the diaphragm 420. It is to be noted that an example in which the first substrate 10 and the second substrate 20 are bonded to each other and a semiconductor sensor other than the pressure sensor 400 is manufactured can be employed.

In the above embodiment, the example in which the second substrate 20 having the film thickness Th2 of 2.5 nm or less is prepared in the preparation process is illustrated, but the present disclosure is not limited to the above example. An example in which the second substrate 20 having the film thickness Th2 of 2.0 nm or less is prepared in the preparation process can be employed. According to the above configuration, when the heating temperature in the heating process is set to a predetermined temperature, the bonding strength can be further increased. Furthermore, the heating temperature necessary for bonding with a predetermined bonding strength can be reduced to a lower temperature. The heating temperature is set to a low temperature, thereby being capable of improving the degree of freedom in designing the wirings and the impurity diffusion layer formed on the first substrate 10 and the second substrate 20.

In the above embodiment, an example in which plasma is generated in the activation process is shown, but the present disclosure is not limited to the above example. As the activation process, an example of irradiating the first substrate 10 and the second substrate 20 with an ion beam can also be employed. In addition, as the activation process, an example in which the first substrate 10 and the second substrate 20 are immersed in an acidic solution can be employed. Furthermore, in the embodiment described above, an example in which the activation process is performed has been described, but the present disclosure is not limited to the above example. An example in which the activation process is not carried out may be employed.

In the above embodiment, an example in which the first substrate 10 and the second substrate 20 are formed of the silicon substrates has been described, but the present disclosure is not limited to the above example. An example in which the first substrate 10 and the second substrate 20 are formed of group III-V semiconductors such as a germanium substrate, sapphire glass, or GaAs can be employed. In addition, even when the silicon oxide films 12 and 22 are replaced with germanium oxide films, the heating temperature in the heating process can be reduced to the low temperature while ensuring the bonding strength.

Further, an example in which a silicon nitride film is formed on the first substrate 10 and the first silicon oxide film 12 is formed on the silicon nitride film can be employed. Similarly, an example in which the silicon nitride film is formed on the second substrate 20 and the second silicon oxide film 22 is formed on the silicon nitride film can be employed.

In the above embodiment, an example in which the first silicon oxide film 12 is formed on the front surface 10a, the back surface 10b, and the side surface 10c in the preparation process has been illustrated, but the present disclosure is not limited to the above example. Any configuration in which the first silicon oxide film 12 is formed on at least the front surface 10a can be employed. Similarly, any configuration in which the second silicon oxide film 22 is formed on at least the front surface 20a can be employed.

In the above embodiment, measurement results of the bonding strength of the first substrate 10 and the second substrate 20 on which the silicon oxide films 12 and 22 are formed by thermal oxidation are shown in FIG. 11. However, as described above, the method of forming the silicon oxide films 12 and 22 is not limited to thermal oxidation.

In the formation method other than thermal oxidation, the density of hydroxyl groups in the silicon oxide films 12 and 22 can be increased as compared with the forming method by thermal oxidation. For that reason, as compared with the forming method by thermal oxidation, the bonding strength can be increased. Therefore, in the forming method other than thermal oxidation, a decrease in bonding strength can be prevented by setting the film thickness Th2 to 2.5 nm or less, similarly to the forming method by the thermal oxidation. In other words, the film thickness Th2 is set to 2.5 nm or less irrespective of the method of forming the silicon oxide films 12 and 22, thereby being capable of preventing the reduction in bonding strength without heating at a high temperature.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A substrate bonding method comprising:
    preparing a first substrate having a first silicon oxide film with a film thickness of 50 nm or more arranged on a surface of the first substrate, and a second substrate having a second silicon oxide film arranged on a surface of the second substrate;
    bonding the first substrate and the second substrate together in a state where the first silicon oxide film and the second silicon oxide film face each other after the preparing of the first substrate and the second substrate;
    heating and bonding the first substrate and the second substrate after the bonding of the first substrate and the second substrate; and
    introducing a hydroxyl group to the first silicon oxide film and the second silicon oxide film after the preparing of the first substrate and the second substrate, wherein:
    the preparing of the first substrate and the second substrate includes preparing the second substrate having the second silicon oxide film with a film thickness of 2.5 nm or less;
    the heating and bonding of the first substrate and the second substrate includes heating the first substrate and the second substrate at a temperature of 300° C. or more and 800° C. or less;

after the introducing of the hydroxyl group, the heating and bonding of the first substrate and the second substrate are executed; and the second silicon oxide film has $SiO_2$ and suboxide, further comprising forming a concave portion on the first substrate in the preparing of the first substrate and the second substrate, wherein:

the concave portion is recessed from the surface of the first substrate.

2. The substrate bonding method according to claim 1, wherein:

the preparing of the first substrate and the second substrate includes preparing the second substrate having the second silicon oxide film with the film thickness of 2.0 nm or less.

3. The substrate bonding method according to claim 1, wherein:

the preparing of the first substrate and the second substrate includes forming the second silicon oxide film on the second substrate by dipping the second substrate in an aqueous solution.

4. The substrate bonding method according to claim 1, wherein:

the preparing of the first substrate and the second substrate includes forming the second silicon oxide film on the second substrate by heating the second substrate.

5. The substrate bonding method according to claim 1, wherein:

the introducing of the hydroxyl group includes activating the first substrate and the second substrate.

6. The substrate bonding method according to claim 5, wherein:

the activating of the first substrate and the second substrate is performed by plasma.

7. The substrate bonding method according to claim 1, wherein:

the heating the first substrate and the second substrate is at a temperature of 600° C. or more and 800° C. or less.

8. The substrate bonding method according to claim 1, wherein:

the heating the first substrate and the second substrate is at a temperature of 750° C. or more and 800° C. or less.

9. The substrate bonding method according to claim 1, wherein:

the heating the first substrate and the second substrate is at a temperature of at a temperature of 300° C. or more and 500° C. or less.

10. The substrate bonding method according to claim 1, wherein:

the suboxide is a silicon oxide having a chemically different structure from the $SiO_2$, and the suboxide includes $Si^{3+}$, $Si^{2+}$, and $Si^+$.

11. The substrate bonding method according to claim 1, wherein:

the first silicon oxide film and the second silicon oxide film contain hydroxyl groups.

12. The substrate bonding method according to claim 1, wherein:

the first oxide film covers the surface of the first substrate and an inner wall of the concave portion.

13. The substrate bonding method according to claim 1, wherein:

the concave portion provides a pressure reference chamber;

in the bonding of the first substrate and the second substrate, the pressure reference chamber is air-tightly sealed; and an internal pressure of the pressure reference chamber is kept constant.

14. The substrate bonding method according to claim 1, wherein:

a portion of the first substrate has a thickness which is reduced by the concave portion;

the portion of the first substrate provides a diaphragm which is deformable according to a pressure of measurement medium.

15. The substrate bonding method according to claim 1, wherein:

the bonding of the first substrate and the second substrate includes bonding the first oxide film with the film thickness of at least 50 nm at the second oxide film with the film thickness of 2.5 nm or less.

* * * * *